(12) United States Patent
Wagoner et al.

(10) Patent No.: US 9,671,442 B2
(45) Date of Patent: Jun. 6, 2017

(54) SYSTEM AND METHOD FOR DETECTING A GRID EVENT

(71) Applicant: General Electric Company, Schenectady, NY (US)

(72) Inventors: Robert Gregory Wagoner, Roanoke, VA (US); Allen Michael Ritter, Roanoke, VA (US); Mark Eugene Shepard, Roanoke, VA (US); Talha Irfanul Haque, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 1163 days.

(21) Appl. No.: 13/689,860

(22) Filed: Nov. 30, 2012

(65) Prior Publication Data

US 2014/0152331 A1    Jun. 5, 2014

(51) Int. Cl.
| | |
|---|---|
| G05D 3/12 | (2006.01) |
| H02M 7/00 | (2006.01) |
| G01R 27/16 | (2006.01) |
| G01R 31/42 | (2006.01) |
| H02J 3/38 | (2006.01) |

(52) U.S. Cl.
CPC ............. *G01R 27/16* (2013.01); *G01R 31/42* (2013.01); *H02J 3/381* (2013.01); *H02J 3/383* (2013.01); *H02J 3/386* (2013.01); *H02J 2003/388* (2013.01); *Y02E 10/563* (2013.01); *Y02E 10/763* (2013.01)

(58) Field of Classification Search
CPC ......... G01R 27/16; G01R 31/42; Y02E 40/72; Y02E 10/563; Y02E 10/763; Y04S 10/123

USPC .............. 324/705; 700/287; 363/13
See application file for complete search history.

(56) References Cited

U.S. PATENT DOCUMENTS

| | | | |
|---|---|---|---|
| 5,450,328 A | 9/1995 | Janke et al. | |
| 6,921,985 B2 | 7/2005 | Janssen et al. | |
| 7,321,221 B2 | 1/2008 | Bucker et al. | |
| 2003/0164695 A1 | 9/2003 | Fasshauer et al. | |
| 2009/0225479 A1* | 9/2009 | Jayanth ............... | G01R 19/10 361/30 |
| 2011/0137474 A1* | 6/2011 | Larsen ................ | F03D 7/0284 700/287 |

(Continued)

FOREIGN PATENT DOCUMENTS

| | | |
|---|---|---|
| EP | 1856795 A2 | 11/2007 |
| WO | 2008153419 A2 | 12/2008 |

OTHER PUBLICATIONS

F. Bertling and S. Soter, "A Novel Converter Integrable Impedance Measuring Method for Islanding Detection in Grids With Widespread Use of Decentral Generation", International Symposium on Power Electronics, Electrical Drives, Automation and Motion, 2006, S17-12-S17-16.

(Continued)

*Primary Examiner* — Farhana Hoque
(74) *Attorney, Agent, or Firm* — Dority & Manning, P.A.

(57) ABSTRACT

A method for detecting a grid event is provided. The method includes sampling grid voltage and grid current over a fixed period of time; determining grid impedance at one or more frequencies using the sampled grid voltage and the sampled grid current; comparing the grid impedance at the one or more frequencies to a known expected grid impedance at the one or more frequencies; and detecting a grid event based on the comparison.

19 Claims, 7 Drawing Sheets

(56) References Cited

U.S. PATENT DOCUMENTS

2012/0133343 A1* 5/2012 Grbovic ................ F03D 9/003
   322/21

OTHER PUBLICATIONS

European Search Report and Opinion issued in connection with corresponding EP Application No. 13192888.9 on Nov. 24, 2016.

* cited by examiner

SYSTEM AND METHOD FOR DETECTING A GRID EVENT

FIELD OF THE INVENTION

The present subject matter relates generally to electrical machines and, more particularly, to a system and method for detecting a grid event on an electrical system connected with the one or more electrical machines.

BACKGROUND OF THE INVENTION

Generally, a wind turbine generator includes a turbine that has a rotor that includes a rotatable hub assembly having multiple blades. The blades transform mechanical wind energy into a mechanical rotational torque that drives one or more generators via the rotor. The generators are generally, but not always, rotationally coupled to the rotor through a gearbox. The gearbox steps up the inherently low rotational speed of the rotor for the generator to efficiently convert the rotational mechanical energy to electrical energy, which is fed into a utility grid via at least one electrical connection. Gearless direct drive wind turbine generators also exist. The rotor, generator, gearbox and other components are typically mounted within a housing, or nacelle, that is positioned on top of a base that may be a truss or tubular tower.

Some wind turbine generator configurations include doubly fed induction generators (DFIGs). Such configurations may also include power converters that are used to transmit generator excitation power to a wound generator rotor from one of the connections to the electric utility grid connection. Moreover, such converters, in conjunction with the DFIG, also transmit electric power between the utility grid and the generator as well as transmit generator excitation power to a wound generator rotor from one of the connections to the electric utility grid connection. Alternatively, some wind turbine configurations include, but are not limited to, alternative types of induction generators, permanent magnet (PM) synchronous generators and electrically-excited synchronous generators and switched reluctance generators.

These alternative configurations may also include power converters that are used to convert the frequencies as described above and transmit electrical power between the utility grid and the generator.

Similar to wind generation, solar power generation is becoming a progressively larger source of energy throughout the world. Solar power generation systems typically include one or more photovoltaic arrays (PV arrays) having multiple interconnected solar cells that convert solar energy into DC power through the photovoltaic effect. In order to interface the output of the PV arrays to a utility grid, a solar converter is needed to change the DC current and DC voltage output of the PV array into a 60/50 Hz AC current waveform that feeds power to the utility grid.

Various solar power converters exist for interfacing the DC output of a PV array into AC power. One implementation of a solar power converter consists of two stages, a boost converter stage and an inverter stage. The boost converter controls the flow of DC power from the PV array onto a DC bus. The inverter converts the power supplied to the DC bus into an AC current and AC voltage that can be output to the AC grid.

In some instances, electrical machines like sources of electrical generation such as the wind turbine generators or photovoltaic arrays described above may be located in remote areas far from the loads they serve. Typically, these sources of generation are connected to the electrical grid through an electrical system such as long transmission lines. These transmission lines are connected to the grid using one or more breakers. In some instances, a grid event can occur on these electrical systems. Such grid events may cause high voltage events, low voltage events, zero voltage events, frequency shifts, phase shifts and the like, that may detrimentally affect the one or more electrical machines if protective actions are not taken. In some instances, these grid events can be caused by opening of one or more phase conductors of the electrical system resulting in islanding of at least one of the one or more electrical machines. Islanding of these electrical machines by sudden tripping of the transmission line breaker at the grid side or otherwise opening these transmission lines while the source of generation is under heavy load may result in an overvoltage on the transmission line that can lead to damage to the source of generation or equipment associated with the source of generation such as converters and inverters. Islanding generally requires disconnecting at least a portion of the affected one or more electrical machines from the electrical system to prevent damaging the electrical machine or equipment associated with the electrical machine. However, in other instances, the grid fault may not be islanding and may be a short term aberration to the electrical system. In these instances, it is desirous to keep the affected electrical machines connected to the electrical system and to institute ride-through procedures such as, for example, high voltage ride through (HVRT), low voltage ride through (LVRT) and zero voltage ride through (ZVRT). Exemplary systems and methods for HVRT, ZVRT and LVRT are described in U.S. Patent Publication U.S. 20120133343 A1 (application Ser. No. 13/323,309) filed Dec. 12, 2011; U.S. Pat. No. 7,321,221 issued Jan. 22, 2008; and U.S. Pat. No. 6,921,985 issued Jul. 26, 2005, respectively, which are fully incorporated herein by reference and made a part hereof.

Failure to properly detect and manage the occurrence of islanding events in wind turbines, photovoltaic arrays, or other power generator systems can be very damaging to those systems, especially when the power generation system is using a doubly fed induction generator typology. When an upstream breaker opens and leaves the wind farm, photovoltaic array or other power generation system isolated from the grid, the ac voltage seen by the power generation source can reach dangerous levels within a few milliseconds. This high ac voltage is more extreme on systems where the remaining connection to the grid has substantial length of power lines that are seen as a shunt capacitance. The event also has potential for a higher degree of damage as the power output of the power generation source increases, for instance, if they are in an overload condition during high winds. In many instances, detection of a grid event, such as islanding, depend on injecting a signal into the grid that would tend to cause a disturbance in some parameter of the grid (such as a current, voltage, frequency, or phase), and measuring the amount this disturbance has on some parameter (such as a current, voltage, frequency, or phase). It is desirable to find a new method of islanding detection without injecting a special voltage, current, phase, or frequency disturbance into the grid.

Accordingly, an improved system and/or method that provides for detecting a grid event without injecting a signal into the grid would be welcomed in the technology.

BRIEF DESCRIPTION OF THE INVENTION

In one aspect, a method for detecting a grid event is provided. The method includes sampling grid voltage and grid current over a fixed period of time; determining grid impedance at one or more frequencies using the sampled grid voltage and the sampled grid current; comparing the grid impedance at the one or more frequencies to a known expected grid impedance at the one or more frequencies; and detecting a grid event based on the comparison.

In another aspect, another method for detecting a grid event on an electrical grid connected with one or more electrical machines is provided. The method includes connecting one or more electrical machines to an alternating current (AC) electric grid, wherein the AC electric grid is configured to transmit at least one phase of electrical power to the one or more electrical machines or to receive at least one phase of electrical power from the one or more electrical machines; electrically coupling at least a portion of a control system to at least a portion of the AC electric grid; coupling at least a portion of the control system in electronic data communication with at least a portion of the one or more electrical machines; detecting a grid event of the AC electric grid based on one or more conditions monitored by the control system wherein the control system is configured to: sample AC grid voltage and AC grid current over a fixed period of time; calculate a frequency transform of the sampled AC grid voltage and sampled AC grid current at one or more frequencies; determine grid impedance at the one or more frequencies using the calculated frequency transform of sampled AC grid voltage divided by the calculated transform of sampled AC grid current; compare the grid impedance at the one or more frequencies to a known expected grid impedance at the one or more frequencies and detect a grid event based on the comparison.

In yet another aspect, a control system for detecting a grid event on an alternating current (AC) electrical grid connected with one or more electrical machines, the AC electric grid configured to transmit at least one phase of electrical power to the one or more electrical machines or to receive at least one phase of electrical power from the one or more electrical machines, is provided. The system includes a controller, wherein the control system is electrically coupled to at least a portion of the AC electric grid and at least a portion of the control system is coupled in electronic data communication with at least a portion of the one or more electrical machines, and wherein the controller is configured to: sample AC grid voltage and AC grid current over a fixed period of time; determine grid impedance at one or more frequencies using the sampled AC grid voltage and the sampled AC grid current; and detect whether a grid event is occurring or has occurred by compare the grid impedance at the one or more frequencies to a known expected grid impedance at the one or more frequencies; and detect a grid event based on the comparison.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of embodiments of the present invention, including the best mode thereof, directed to one of ordinary skill in the art, is set forth in the specification, which makes reference to the appended figures, in which.

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Generally disclosed herein are systems and methods of detecting a grid event on an electrical grid connected with one or more electrical machines. Such electrical machines can include, for example, electric motors; electric generators including, for example, wind turbine generators, gas turbine generators, steam turbine generators, and the like; solar/photovoltaic generation; and the like, and any ancillary equipment associated with such electric machines. In one aspect, embodiments of the present invention disclose systems and methods to rapidly detect a grid event on an electrical system connected to one or more electrical machines such as wind turbine generators or photovoltaic arrays by sampling grid voltage and grid current over a fixed period of time; determining grid impedance at one or more frequencies using the sampled grid voltage and the sampled grid current; and detecting whether a grid event is occurring or has occurred by comparing the grid impedance at the one or more frequencies to a known expected grid impedance range at the one or more frequencies.

Figure 1:
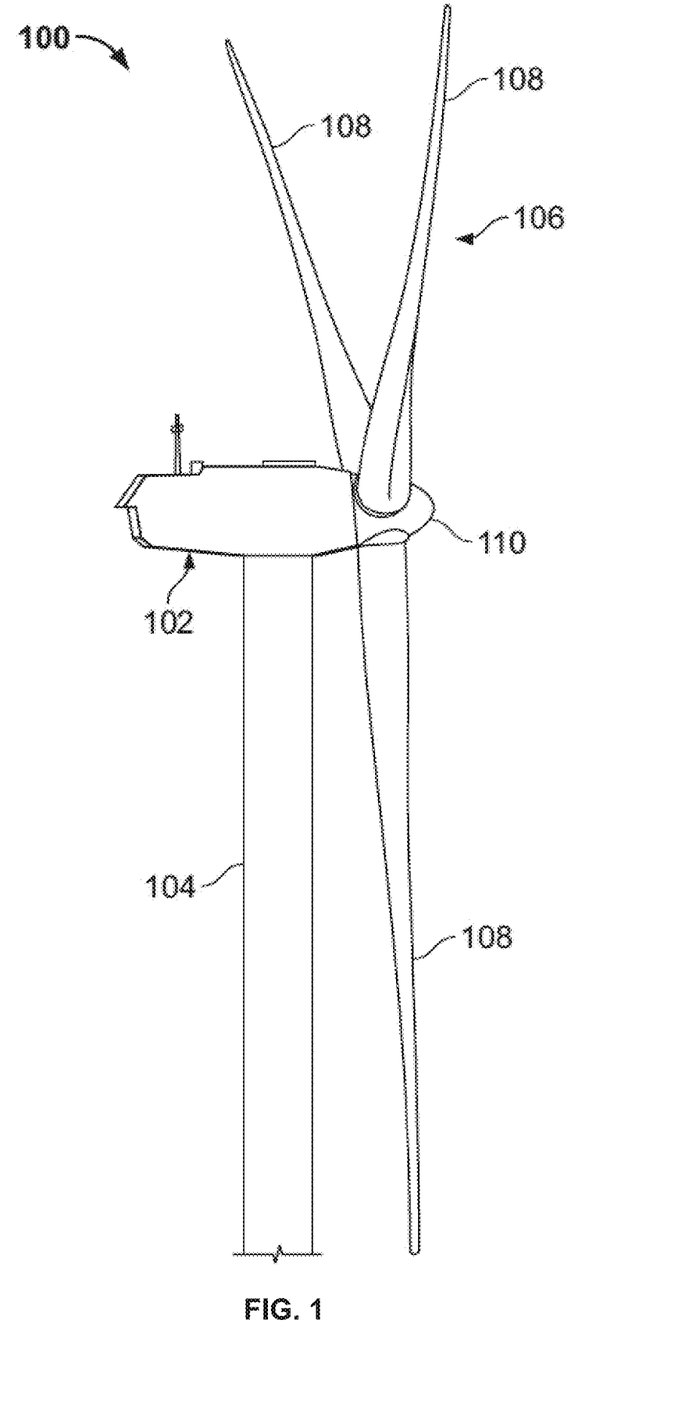
FIG. 1 is a schematic view of an exemplary wind turbine generator.

Consider as a non-limiting example FIG. 1, which is a schematic view of an exemplary wind turbine generator 100. The wind turbine 100 includes a nacelle 102 housing a generator (not shown in FIG. 1). Nacelle 102 is mounted on a tower 104 (a portion of tower 104 being shown in FIG. 1). Tower 104 may be any height that facilitates operation of wind turbine 100 as described herein. Wind turbine 100 also includes a rotor 106 that includes three rotor blades 108 attached to a rotating hub 110. Alternatively, wind turbine 100 includes any number of blades 108 that facilitate operation of wind turbine 100 as described herein. In the exemplary embodiment, wind turbine 100 includes a gearbox (not shown in FIG. 1) rotatingly coupled to rotor 106 and a generator (not shown in FIG. 1).

Figure 2:
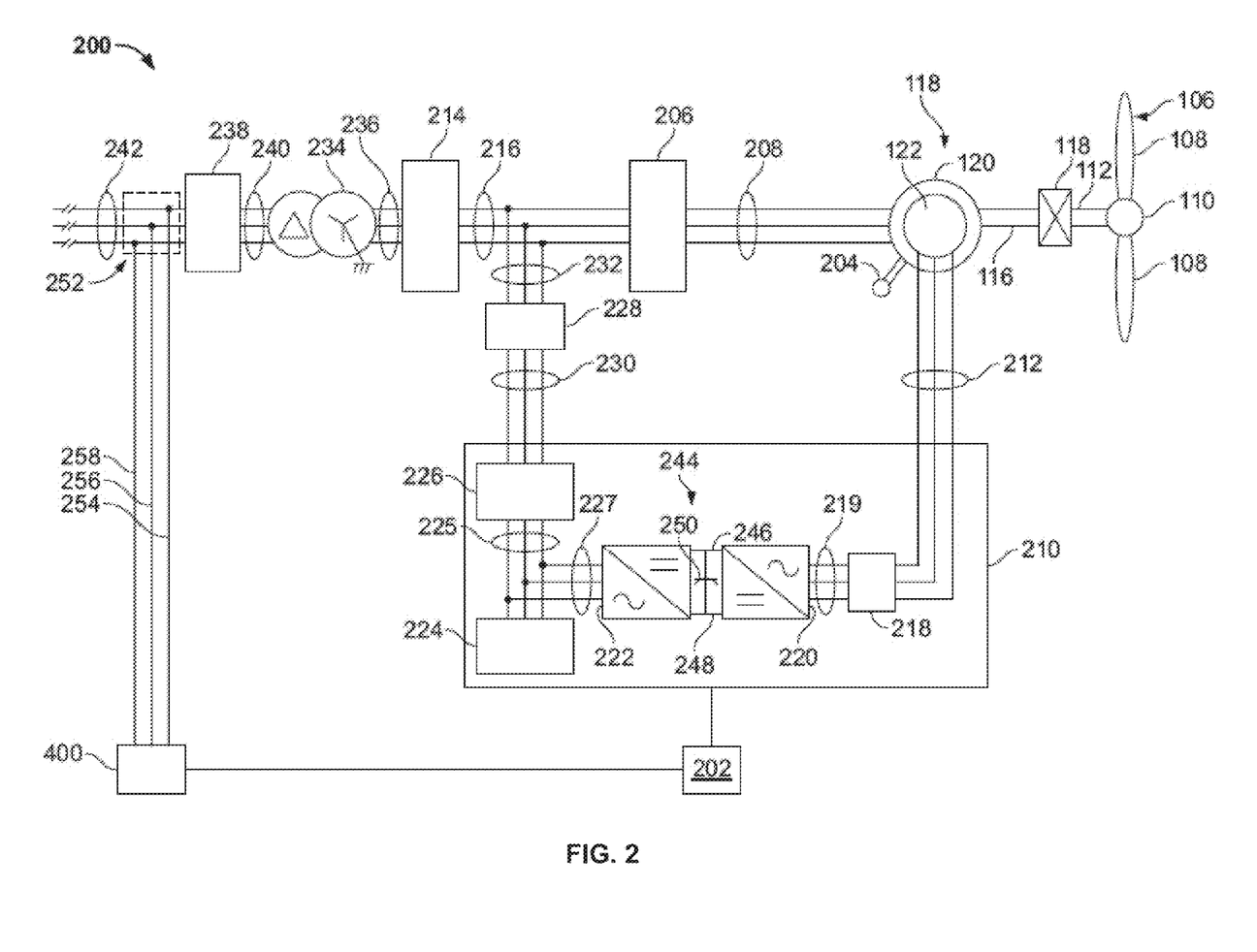
FIG. 2 is a schematic view of an exemplary electrical and control system that may be used with the wind turbine generator shown in FIG. 1.

FIG. 2 is a schematic view of an exemplary electrical and control system 200 that may be used with wind turbine generator 100 (shown in FIG. 1). Rotor 106 includes plurality of rotor blades 108 coupled to rotating hub 110. Rotor 106 also includes a low-speed shaft 112 rotatably coupled to hub 110. Low-speed shaft is coupled to a step-up gearbox 114. Gearbox 114 is configured to step up the rotational speed of low-speed shaft 112 and transfer that speed to a high-speed shaft 116. In the exemplary embodiment, gearbox 114 has a step-up ratio of approximately 70:1. For example, low-speed shaft 112 rotating at approximately 20 revolutions per minute (20) coupled to gearbox 114 with an approximately 70:1 step-up ratio generates a high-speed shaft 116 speed of approximately 1400 rpm. Alternatively, gearbox 114 has any step-up ratio that facilitates operation of wind turbine 100 as described herein. Also, alternatively, wind turbine 100 includes a direct-drive generator wherein a generator rotor (not shown in FIG. 1) is rotatingly coupled to rotor 106 without any intervening gearbox.

High-speed shaft 116 is rotatably coupled to generator 118. In the exemplary embodiment, generator 118 is a wound rotor, synchronous, 60 Hz, three-phase, doubly-fed induction generator (DFIG) that includes a generator stator 120 magnetically coupled to a generator rotor 122. Alternatively, generator 118 is any generator of any number of phases that facilitates operation of wind turbine 100 as described herein.

Electrical and control system 200 includes a controller 202. Controller 202 includes at least one processor and a memory, at least one processor input channel, at least one processor output channel, and may include at least one computer (none shown in FIG. 2). As used herein, the term computer is not limited to just those integrated circuits referred to in the art as a computer, but broadly refers to a processor, a microcontroller, a microcomputer, a programmable logic controller (PLC), an application specific integrated circuit, and other programmable circuits (none shown in FIG. 2), and these terms are used interchangeably herein. In the exemplary embodiment, memory may include, but is not limited to, a computer-readable medium, such as a random access memory (RAM) (none shown in FIG. 2). Alternatively, a floppy disk, a compact disc—read only memory (CD-ROM), a magneto-optical disk (MOD), and/or a digital versatile disc (DVD) (none shown in FIG. 2) may also be used. Also, in the exemplary embodiment, additional input channels (not shown in FIG. 2) may be, but not be limited to, computer peripherals associated with an operator interface such as a mouse and a keyboard (neither shown in FIG. 2). Alternatively, other computer peripherals may also be used that may include, for example, but not be limited to, a scanner (not shown in FIG. 2). Furthermore, in the exemplary embodiment, additional output channels may include, but not be limited to, an operator interface monitor (not shown in FIG. 2).

Processors for controller 202 process information transmitted from a plurality of electrical and electronic devices that may include, but not be limited to, speed and power transducers, current transformers and/or current transducers, breaker position indicators, potential transformers and/or voltage transducers, and the like. RAM and storage device store and transfer information and instructions to be executed by the processor. RAM and storage devices can also be used to store and provide temporary variables, static (i.e., non-changing) information and instructions, or other intermediate information to the processors during execution of instructions by the processors. Instructions that are executed include, but are not limited to, resident conversion and/or comparator algorithms. The execution of sequences of instructions is not limited to any specific combination of hardware circuitry and software instructions.

Electrical and control system 200 also includes generator rotor tachometer 204 that is coupled in electronic data communication with generator 118 and controller 202. Generator stator 120 is electrically coupled to a stator synchronizing switch 206 via a stator bus 208. In the exemplary embodiment, to facilitate the DFIG configuration, generator rotor 122 is electrically coupled to a bi-directional power conversion assembly 210 via a rotor bus 212. Alternatively, system 200 is configured as a full power conversion system (not shown) known in the art, wherein a full power conversion assembly (not shown) that is similar in design and operation to assembly 210 is electrically coupled to stator 120 and such full power conversion assembly facilitates channeling electrical power between stator 120 and an electric power transmission and distribution grid (not shown). Stator bus 208 transmits three-phase power from stator 120 and rotor bus 212 transmits three-phase power from rotor 122 to assembly 210. Stator synchronizing switch 206 is electrically coupled to a main transformer circuit breaker 214 via a system bus 216.

Assembly 210 includes a rotor filter 218 that is electrically coupled to rotor 122 via rotor bus 212. Rotor filter 218 is electrically coupled to a rotor-side, bi-directional power converter 220 via a rotor filter bus 219. Converter 220 is electrically coupled to a line-side, bi-directional power converter 222. Converters 220 and 222 are substantially identical. Power converter 222 is electrically coupled to a line filter 224 and a line contactor 226 via a line-side power converter bus 223 and a line bus 225. In the exemplary embodiment, converters 220 and 222 are configured in a three-phase, pulse width modulation (PWM) configuration including insulated gate bipolar transistor (IGBT) switching devices (not shown in FIG. 2) that "fire" as is known in the art. Alternatively, converters 220 and 222 have any configuration using any switching devices that facilitate operation of system 200 as described herein. Assembly 210 is coupled in electronic data communication with controller 202 to control the operation of converters 220 and 222.

Line contactor 226 is electrically coupled to a conversion circuit breaker 228 via a conversion circuit breaker bus 230. Circuit breaker 228 is also electrically coupled to system circuit breaker 214 via system bus 216 and connection bus 232. System circuit breaker 214 is electrically coupled to an electric power main transformer 234 via a generator-side bus 236. Main transformer 234 is electrically coupled to a grid circuit breaker 238 via a breaker-side bus 240. Grid breaker 238 is connected to an electric power transmission and distribution grid via a grid bus 242.

In the exemplary embodiment, converters 220 and 222 are coupled in electrical communication with each other via a single direct current (DC) link 244. Alternatively, converters 220 and 222 are electrically coupled via individual and separate DC links (not shown in FIG. 2). DC link 244 includes a positive rail 246, a negative rail 248, and at least one capacitor 250 coupled therebetween. Alternatively, capacitor 250 is one or more capacitors configured in series or in parallel between rails 246 and 248.

System 200 can further include a phase-locked loop (PLL) regulator 400 that is configured to receive a plurality of voltage measurement signals from a plurality of voltage transducers 252. In the exemplary embodiment, each of three voltage transducers 252 are electrically coupled to each one of the three phases of bus 242. Alternatively, voltage transducers 252 are electrically coupled to system bus 216. Also, alternatively, voltage transducers 252 are electrically coupled to any portion of system 200 that facilitates operation of system 200 as described herein. PLL regulator 400 is coupled in electronic data communication with controller 202 and voltage transducers 252 via a plurality of electrical conduits 254, 256, and 258. Alternatively, PLL regulator 400 is configured to receive any number of voltage measurement signals from any number of voltage transducers 252, including, but not limited to, one voltage measurement signal from one voltage transducer 252. Controller 202 can also receive any number of current feedbacks from current transformers or current transducers that are electrically coupled to any portion of system 200 that facilitates operation of system 200 as described herein such as, for example, stator current feedback from stator bus 208, grid current feedback from generator side bus 236, and the like.

During operation, wind impacts blades 108 and blades 108 transform mechanical wind energy into a mechanical rotational torque that rotatingly drives low-speed shaft 112 via hub 110. Low-speed shaft 112 drives gearbox 114 that subsequently steps up the low rotational speed of shaft 112 to drive high-speed shaft 116 at an increased rotational speed. High speed shaft 116 rotatingly drives rotor 122. A rotating magnetic field is induced within rotor 122 and a voltage is induced within stator 120 that is magnetically coupled to rotor 122. Generator 118 converts the rotational mechanical energy to a sinusoidal, three-phase alternating current (AC) electrical energy signal in stator 120. The associated electrical power is transmitted to main transformer 234 via bus 208, switch 206, bus 216, breaker 214 and bus 236. Main transformer 234 steps up the voltage amplitude of the electrical power and the transformed electrical power is further transmitted to an electrical grid (not shown FIG. 2) via bus 240, circuit breaker 238 and bus 242.

In the doubly-fed induction generator configuration, a second electrical power transmission path is provided. Electrical, three-phase, sinusoidal, AC power is generated within wound rotor 122 and is transmitted to assembly 210 via bus 212. Within assembly 210, the electrical power is transmitted to rotor filter 218 wherein the electrical power is modified for the rate of change of the PWM signals associated with converter 220. Converter 220 acts as a rectifier and rectifies the sinusoidal, three-phase AC power to DC power. The DC power is transmitted into DC link 244. Capacitor 250 facilitates mitigating DC link 244 voltage amplitude variations by facilitating mitigation of a DC ripple associated with AC rectification.

The DC power is subsequently transmitted from DC link 244 to power converter 222 wherein converter 222 acts as an inverter configured to convert the DC electrical power from DC link 244 to three-phase, sinusoidal AC electrical power with pre-determined voltages, currents, and frequencies. This conversion is monitored and controlled via controller 202. The converted AC power is transmitted from converter 222 to bus 216 via buses 227 and 225, line contactor 226, bus 230, circuit breaker 228, and bus 232. Line filter 224 compensates or adjusts for harmonic currents in the electric power transmitted from converter 222. Stator synchronizing switch 206 is configured to close such that connecting the three-phase power from stator 120 with the three-phase power from assembly 210 is facilitated.

Circuit breakers 228, 214, and 238 are configured to disconnect corresponding buses, for example, when current flow is excessive and can damage the components of the system 200. Additional protection components are also provided, including line contactor 226, which may be controlled to form a disconnect by opening a switch (not shown in FIG. 2) corresponding to each of the lines of the line bus 230.

Assembly 210 compensates or adjusts the frequency of the three-phase power from rotor 122 for changes, for example, in the wind speed at hub 110 and blades 108. Therefore, in this manner, mechanical and electrical rotor frequencies are decoupled and the electrical stator and rotor frequency matching is facilitated substantially independently of the mechanical rotor speed.

Under some conditions, the bi-directional characteristics of assembly 210, and specifically, the bi-directional characteristics of converters 220 and 222, facilitate feeding back at least some of the generated electrical power into generator rotor 122. More specifically, electrical power is transmitted from bus 216 to bus 232 and subsequently through circuit breaker 228 and bus 230 into assembly 210. Within assembly 210, the electrical power is transmitted through line contactor 226 and busses 225 and 227 into power converter 222. Converter 222 acts as a rectifier and rectifies the sinusoidal, three-phase AC power to DC power. The DC power is transmitted into DC link 244. Capacitor 250 facilitates mitigating DC link 244 voltage amplitude variations by facilitating mitigation of a DC ripple sometimes associated with three-phase AC rectification.

The DC power is subsequently transmitted from DC link 244 to power converter 220 wherein converter 220 acts as an inverter configured to convert the DC electrical power transmitted from DC link 244 to a three-phase, sinusoidal AC electrical power with pre-determined voltages, currents, and frequencies. This conversion is monitored and controlled via controller 202. The converted AC power is transmitted from converter 220 to rotor filter 218 via bus 219 is subsequently transmitted to rotor 122 via bus 212. In this manner, generator reactive power control is facilitated.

Assembly 210 is configured to receive control signals from controller 202. The control signals are based on sensed conditions or operating characteristics of wind turbine 100 and system 200 as described herein and used to control the operation of the power conversion assembly 210. For example, tachometer 204 feedback in the form of sensed speed of the generator rotor 122 may be used to control the conversion of the output power from rotor bus 212 to maintain a proper and balanced three-phase power condition. Other feedback from other sensors also may be used by system 200 to control assembly 210 including, for example, stator and rotor bus voltages and current feedbacks, grid current, grid voltage, grid frequency, and the like. Using this feedback information, and for example, switching control signals, stator synchronizing switch control signals, system circuit breaker control (trip) signals, and other signals for controlling the generator 118, converter system 210, grid, and the like may be generated in any known manner. For example, for a grid event with predetermined characteristics such as islanding, controller 202 may take actions including, for example, temporarily substantially suspend firing of the IGBTs within converters 220, 222. This process can also be referred to as "gating off" the IGBTs in converters 220, 222. Such suspension of operation of converters 220, 222 will substantially mitigate electric power being channeled through conversion assembly 210 to approximately zero.

Figure 3A:
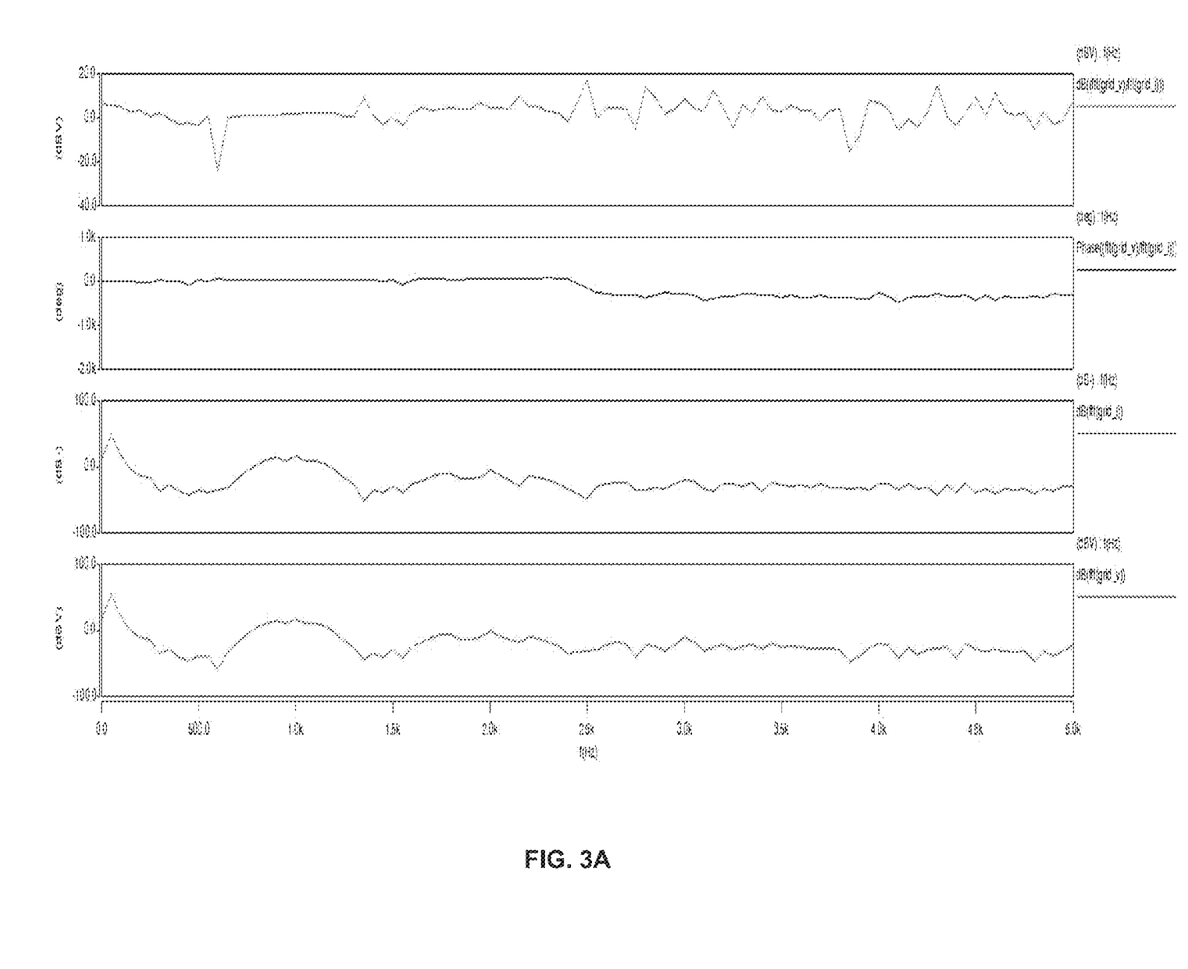
FIGS. 3A and 3B show examples of grid impedance with a normal grid (FIG. 3A) and when an islanding condition exists (FIG. 3B)
Figure 3B:
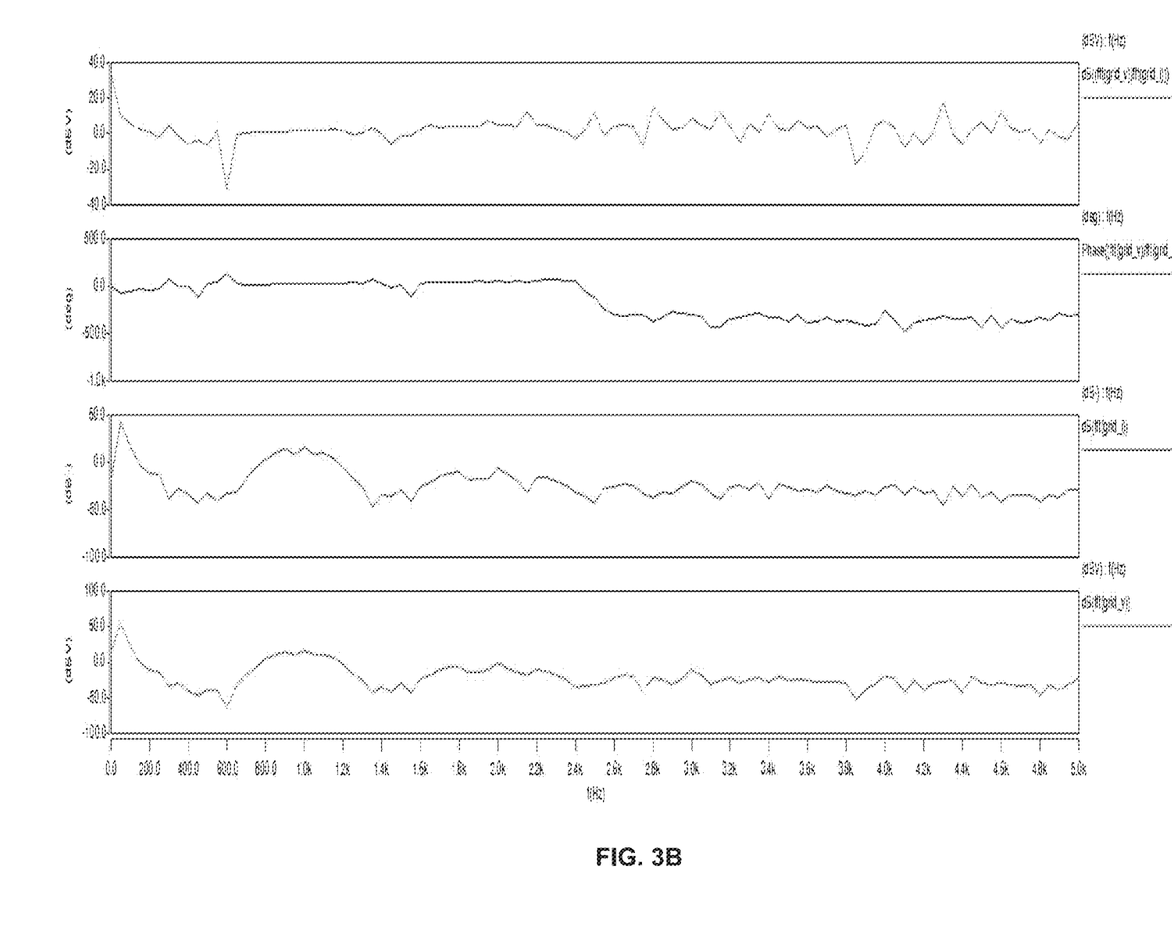
Figure 3C:
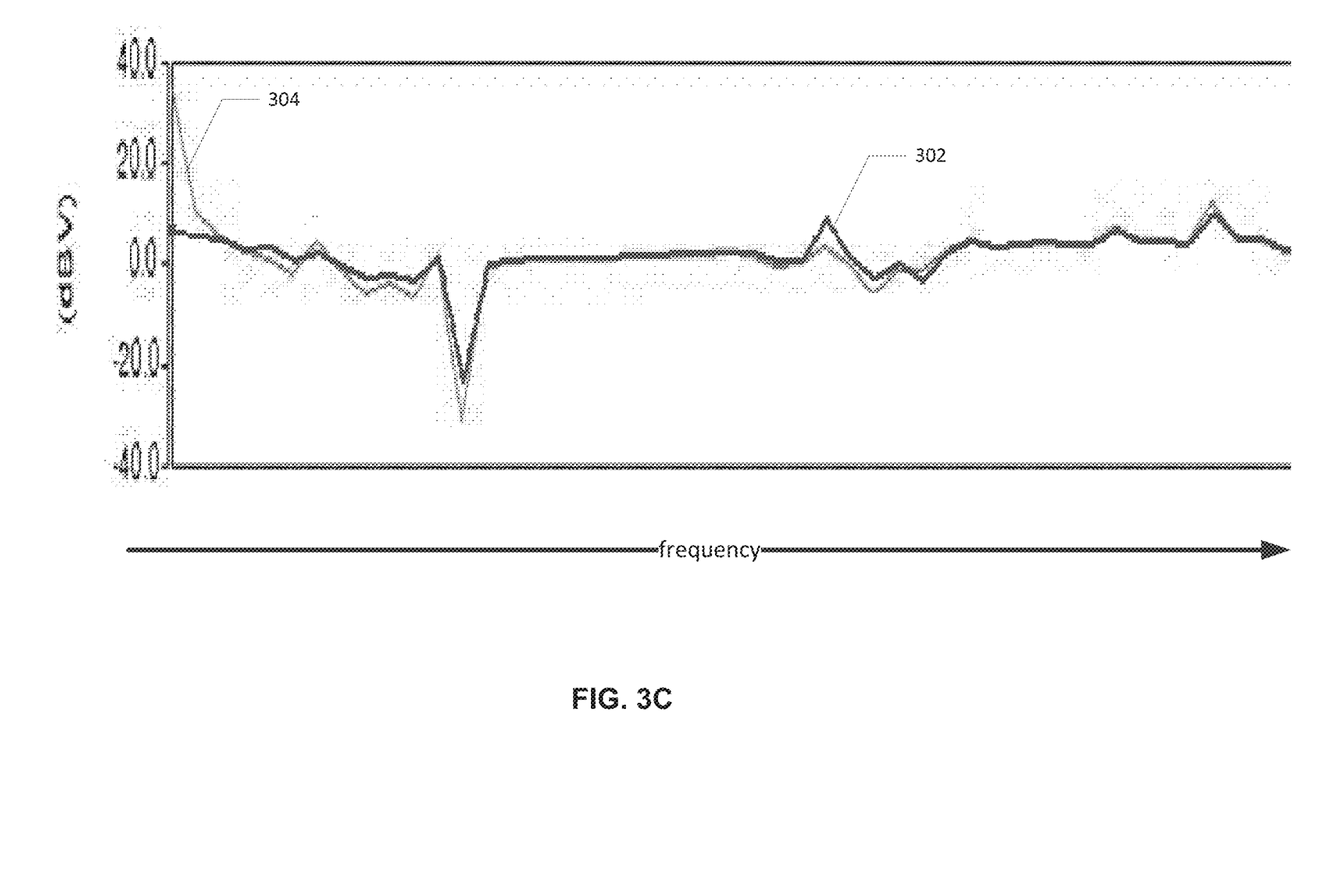
FIG. 3C illustrates a portion of the graph of normal grid impedance (FIG. 3A) overlaid with a portion of the graph of impedance during an open grid (e.g., an islanding condition) (FIG. 3B) to show the difference in impedance magnitude at the various frequencies.

As shown in FIG. 2, a power source such as generator 118 can be coupled to a utility grid through a power converter system 210. Under normal operating conditions, the power converter system 210 can generate a frequency spectrum of output currents based on the PWM method of creating the fundamental frequency by modulating a higher frequency carrier waveform. This spectrum of output currents can have strong components at the fundamental frequency as well as at the carrier frequency and various combinations/multiples of the two. Effectively the power converter 210 naturally creates a broadband noise source as part of its normal operation. It is not necessary to inject any special signal into the grid to determine a grid event such as an islanding condition. Instead, it is possible to measure the grid impedance, using the natural broadband noise source of the converter, by determining grid impedance at one or more frequencies and comparing the measured grid impedance at the one or more frequencies at any time to the expected grid impedance or ranges of grid impedance of a normal grid at the one or more frequencies. In one aspect, grid impedance at the one or more frequencies can be determined by taking frequency-domain transforms (e.g., Fast Fourier transforms (FFT), Discrete Fourier transforms (DFT), and the like) of grid voltage and grid current. In another aspect, grid impedance at the one or more frequencies can be determined by filtering of grid voltage and grid current at one or more frequencies. Embodiments of the invention are intended to encompass any method of determining grid impedance at the one or more frequencies from sampled grid voltage and grid current. Regardless of the method used to determine grid impedance at one or more frequencies, once determined the measured grid impedance at one or more frequencies at any time can be compared to the expected grid impedance of a normal grid at one or more frequencies to determine if a grid event, such as islanding, is occurring or has occurred. FIGS. 3A and 3B show examples of grid impedance with a normal grid (FIG. 3A) and when an islanding condition exists (FIG. 3B), particularly evident at the frequencies with high energy produced by the converter system 210. FIG. 3A shows exemplary graphs of normal grid conditions. The top graph of FIG. 3A shows the a magnitude of FFT of grid voltage divided by a FFT of grid current at various frequencies, the second from the top graph of FIG. 3A shows a phase FFT of grid voltage divided by a FFT of grid current at various frequencies; the third from the top graph of FIG. 3A shows a magnitude FFT of grid current at various frequencies and the bottom graph of FIG. 3A shows a magnitude FFT of grid voltage at various frequencies. FIG. 3B shows exemplary graphs of grid conditions during a grid event such as islanding. The top graph of FIG. 3B shows the a magnitude of FFT of grid voltage divided by a FFT of grid current at various frequencies, the second from the top graph of FIG. 3B shows a phase FFT of grid voltage divided by a FFT of grid current at various frequencies; the third from the top graph of FIG. 3B shows a magnitude FFT of grid current at various frequencies and the bottom graph of FIG. 3B shows a magnitude FFT of grid voltage at various frequencies. As can be seen, there is a significant change in the grid impedance at one or more frequencies when a grid event such as an islanding condition exists. Therefore, it can be seen that the change in impedance at the various frequencies can be used to detect a grid event such as islanding. FIG. 3C illustrates a portion of the graph of normal grid impedance (FIG. 3A) overlaid with a portion of the graph of impedance during an open grid (e.g., an islanding condition) (FIG. 3B) to show the difference in impedance magnitude at the various frequencies. As can be seen, the line 302 denoting normal grid impedance varies significantly from the line 304 denoting grid impedance during an open grid condition such as islanding at various frequencies. This difference can be used to detect grid events that are occurring or have occurred on the electrical system.

Figure 4:
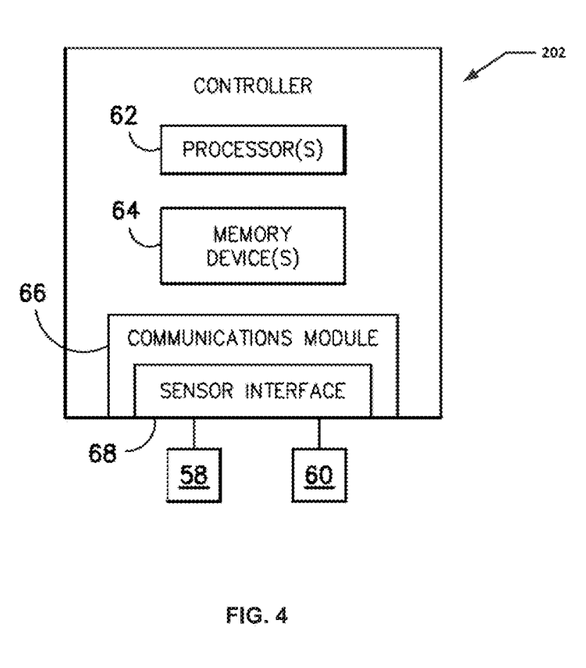
FIG. 4 illustrates a block diagram of one embodiment of suitable components that may be included within an embodiment of a controller, or any other computing device that receives signals indicating a grid fault in accordance with aspects of the present subject matter.

Referring now to FIG. 4, as noted above, some embodiments of systems for detecting grid events can include a control system or controller 202. In general, the controller 202 may comprise a computer or other suitable processing unit. Thus, in several embodiments, the controller 202 may include suitable computer-readable instructions that, when implemented, configure the controller 202 to perform various different functions, such as receiving, transmitting and/or executing control signals. As such, the controller 202 may generally be configured to control the various operating modes (e.g., conducting or non-conducting states) of the one or more switches and/or components of embodiments of the electrical system 200. For example, the controller 200 may be configured to implement methods of detecting a grid event on an electrical system connected with the one or more electrical machines.

FIG. 4 illustrates a block diagram of one embodiment of suitable components that may be included within an embodiment of a controller 202, or any other computing device that receives signals indicating grid conditions in accordance with aspects of the present subject matter. In various aspects, such signals can be received from one or more sensors or transducers 58, 60, or may be received from other computing devices (not shown) such as a supervisory control and data acquisition (SCADA) system, a turbine protection system, PLL regulator 400 and the like. Received signals can include, for example, voltage signals such as DC bus 244 voltage and AC grid voltage along with corresponding phase angles for each phase of the AC grid, current signals, power flow (direction) signals, power output from the converter system 210, total power flow into (or out of) the grid, and the like. In some instances, signals received can be used by the controller 202 to calculate other variables such as changes in voltage phase angles over time, changes in impedance at various frequencies, and the like. As shown, the controller 202 may include one or more processor(s) 62 and associated memory device(s) 64 configured to perform a variety of computer-implemented functions (e.g., performing the methods, steps, calculations and the like disclosed herein). As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 64 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 64 may generally be configured to store suitable computer-readable instructions that, when implemented by the processor(s) 62, configure the controller 202 to perform various functions including, but not limited to, directly or indirectly transmitting suitable control signals to one or more switches that comprise the bi-directional power conversion assembly 210, monitoring operating conditions of the electrical system 200, and various other suitable computer-implemented functions.

Additionally, the controller 202 may also include a communications module 66 to facilitate communications between the controller 202 and the various components of the electrical system 200 and/or the one or more sources of electrical generation 118. For instance, the communications module 66 may serve as an interface to permit the controller 202 to transmit control signals to one or more switches that comprise the bi-directional power conversion assembly 210 to change to a conducting or non-conducting state or to control any other device or component that comprises the electrical system 200. Moreover, the communications module 66 may include a sensor interface 68 (e.g., one or more analog-to-digital converters) to permit signals transmitted from the sensors (e.g., 58, 60) to be converted into signals that can be understood and processed by the processors 62. Alternatively, the controller 202 may be provided with suitable computer readable instructions that, when implemented by its processor(s) 62, configure the controller 202 to determine based on a first received indicator whether an islanding of the one or more sources of electrical generation 118 has occurred based on information stored within its memory 64 and/or based on an input received from the electrical system by the controller 202. Similarly, the controller 202 may be provided with suitable computer readable instructions that, when implemented by its processor(s) 62, configure the controller 202 to determine based on the one or more additional condition indicators whether a grid event on an electrical system connected with the one or more electrical machines 118 has occurred based on information stored within its memory 64 and/or based on other inputs received from the electrical system 200 by the controller 202.

Figure 5:
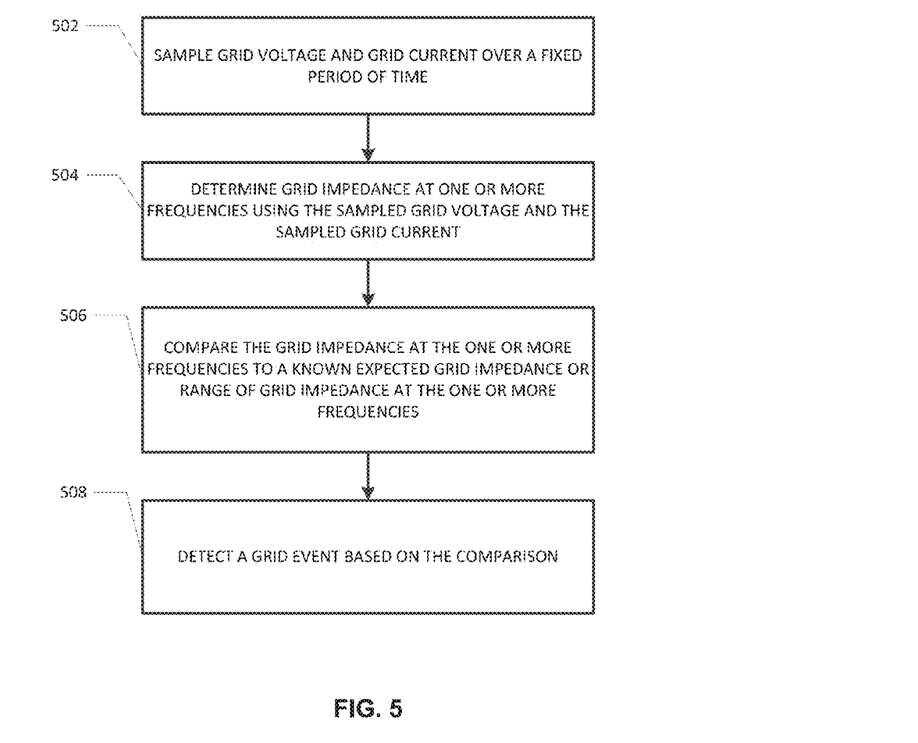
FIG. 5 is a flowchart illustrating an embodiment of a method of detecting a grid event on an electrical system connected with one or more electrical machines such as wind turbine generators.

FIG. 5 is a flowchart illustrating an embodiment of a method of detecting a grid event on an electrical system connected with one or more electrical machines such as wind turbine generators. Embodiments of steps of the method described in FIG. 5 can be performed by one or more computing devices such as controller 202. At step 502, grid voltage and grid current are sampled over a fixed period of time. The sampling period can be any period of time as desired. For example, in one aspect sampling grid voltage and grid current over the fixed period of time comprises sampling grid voltage and grid current over one cycle of a fundamental frequency, as the fundamental frequency is determined by a frequency-domain transform of the grid voltage or grid current. In some instances, the fixed period of time may cause an undesirable delay in detecting a grid event. Therefore, the defined time period for sampling may be reduced so that when using FFT analysis or any other method to calculate impedance for detecting a grid event, the analysis may be updated every few microseconds.

At step 504, grid impedance can be determined using the sampled grid voltage and the sampled grid current. In one aspect, determining grid impedance at one or more frequencies using the sampled grid voltage and the sampled grid current comprises calculating a transform of the sampled grid voltage and sampled grid current at the one or more frequencies and determining the grid impedance at the one or more frequencies using the calculated transform of sampled grid voltage divided by the calculated transform of sampled grid current. In one aspect, calculating the transform of the sampled grid voltage and sampled grid current comprises calculating a Fourier transform of the sampled grid voltage and sampled grid current. In one aspect, calculating the Fourier transform of the sampled grid voltage and sampled grid current comprises calculating a fast Fourier transform (FFT) of at least one of the sampled grid voltage and sampled grid current or a DFT of at least one of the sampled grid voltage and sampled grid current. In one aspect, a frequency response or transfer function of a system can be calculated using power spectra of an impulse/transient/noise input, x, and correlated output, y, by determing where there is the cross correlation (crosspower spectrum) between output and input and the autocorrelation (autopower spectrum) of the output. The idea can be extended to determine grid impedance by analyzing the grid transient currents and voltages, The above ratio (V/I) can be calculated by using, for example, the Welch method: (1) Divide the input and output data in equal numbers of overlapping segments; (2) Apply a windowing function on each segment for both input and output; (3) Apply n-point FFT on each windowed segment for both input and output; (4) Compute modified periodogram for each windowed segment of the output; (5) Compute modified periodogram for respective windowed segments of input and output; (6) Auto-spectrum estimate is formed by averaging all the modified periodograms for the output stream; (7) Cross-spectrum estimate is formed by averaging all the modified periodograms for input/output streams; (8) Appropriately scale the resultant spectrum estimates to compute power spectral densities; and (9) Take the ratio (V/I) as shown above to calculate impedance over a frequency range.

In another aspect, determining grid impedance at one or more frequencies using the sampled grid voltage and the sampled grid current comprises filtering the grid voltage and filtering the grid current at the one or more frequencies and determining the grid impedance at the one or more frequencies using the filtered grid voltage divided by the filtered grid current at the one or more frequencies.

At step 506, the grid impedance at the one or more frequencies can be compared to a known expected grid impedance or range of grid impedance at the one or more frequencies. In one aspect, comparing the grid impedance at the one or more frequencies to the known expected grid impedance or range of grid impedance at the one or more frequencies comprises comparing the grid impedance at the one or more frequencies to the known expected grid impedance or range of grid impedance at one or more selected frequencies. At step 508, a grid event can be detected based on the comparison performed in step 506. In various aspects, detecting a grid event can be performed by comparing calculated magnitude, phase, or some combination of the two with a known expected grid impedance or range of grid impedance (magnitude, phase, or some combination of the two). Aspects of the calculated impedance at the one or more frequencies as compared to the known expected impedance or range of grid impedance at the one or more frequencies can be used to detect grid events. For example, the effective resistance of the impedance (damping for real resistance, or divergent for negative resistance), as well as the shift in the grid impedance from inductive to capacitive during an islanding event can be used for detection. In one aspect, detecting the grid event by comparing the grid impedance at the one or more frequencies to the known expected grid impedance or range of grid impedance comprises detecting that the grid event is occurring or has occurred if the grid impedance at the one or more frequencies is outside the known expected grid impedance or range of grid impedance at the one or more frequencies. In another example, detecting the grid event by comparing the grid impedance at the one or more frequencies to the known expected grid impedance or range of grid impedance at the one or more frequencies comprises detecting that the grid event is not occurring or has not occurred if the grid impedance at the one or more frequencies is within the known expected grid impedance or range of grid impedance at the one or more frequencies. In one aspect, detecting the grid event based on the comparison comprises detecting that the grid event comprises islanding of an electrical generator. For example, the electrical generator can comprise a doubly-fed induction generator (DFIG) driven by a wind turbine or a photovoltaic array.

As described above and as will be appreciated by one skilled in the art, embodiments of the present invention may be configured as a system, method, or a computer program product. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable non-transitory computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus, such as the processor(s) 62 discussed above with reference to FIG. 4, to produce a machine, such that the instructions which execute on the computer or other programmable data processing apparatus create a means for implementing the functions specified in the flowchart block or blocks.

These computer program instructions may also be stored in a non-transitory computer-readable memory that can direct a computer or other programmable data processing apparatus (e.g., processor(s) 62 of FIG. 4) to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for detecting a grid event on an alternating current (AC) electric grid, the method comprising:
   electrically coupling at least a portion of a control system to at least a portion of the AC electric grid;
   detecting a grid event of the AC electric grid based on one or more conditions monitored by the control system, wherein detecting the grid event further comprises;
   sampling alternating current (AC) grid voltage and AC grid current over a fixed period of time;
   calculating a Fourier transform of the sampled AC grid voltage at one or more frequencies;
   calculating a Fourier transform of the sampled AC grid current at one or more frequencies;
   determining grid impedance at the one or more frequencies using the calculated Fourier transform of the sampled AC grid voltage divided by the calculated Fourier transform of sampled AC grid current;
   comparing the grid impedance at the one or more frequencies to a known expected grid impedance at the one or more frequencies; and
   detecting the grid event based on the comparison.

2. The method of claim 1, wherein calculating the Fourier transform of the sampled grid voltage and calculating the Fourier transform of the sampled grid current comprises calculating a fast Fourier transform (FFT) of at least one of the sampled grid voltage and sampled grid current.

3. The method of claim 1, wherein determining grid impedance at the one or more frequencies using the calculated Fourier transform of the sampled grid voltage divided by the calculated Fourier transform of the sampled grid current comprises filtering the sampled grid voltage and filtering the sampled grid current at the one or more frequencies and determining the grid impedance at the one or more frequencies using the filtered grid voltage divided by the filtered grid current at the one or more frequencies.

4. The method of claim 1, wherein sampling grid voltage and grid current over the fixed period of time comprises sampling grid voltage and grid current over one cycle of a fundamental frequency.

5. The method of claim 1, wherein comparing the grid impedance at the one or more frequencies to the known expected grid impedance at the one or more frequencies comprises comparing the grid impedance at the one or more frequencies to a known expected grid impedance range at the one or more frequencies.

6. The method of claim 5, wherein detecting the grid event based on the comparison comprises detecting the grid event if the grid impedance at the one or more frequencies is outside the known expected grid impedance range at the one or more frequencies.

7. The method of claim 5, wherein detecting the grid event based on the comparison comprises detecting the grid event if the grid impedance at the one or more frequencies is within the known expected grid impedance range at the one or more frequencies.

8. The method of claim 1, wherein detecting the grid event based on the comparison comprises detecting that the grid event comprises islanding of an electrical generator.

9. The method of claim 8, wherein the electrical generator comprises a doubly-fed induction generator (DFIG) driven by a wind turbine or a photovoltaic array.

10. A method of detecting a grid event on an electrical grid connected with one or more electrical machines, said method comprising:
    connecting the one or more electrical machines to an alternating current (AC) electric grid, wherein the AC electric grid is configured to transmit at least one phase of electrical power to the one or more electrical machines or to receive at least one phase of electrical power from the one or more electrical machines;
    electrically coupling at least a portion of a control system to at least a portion of the AC electric grid;
    coupling at least a portion of the control system in electronic data communication with at least a portion of the one or more electrical machines;
    detecting a grid event of the AC electric grid based on one or more conditions monitored by the control system wherein the control system is configured to:
    sample AC grid voltage and AC grid current over a fixed period of time;
    calculate a Fourier transform of the sampled AC grid voltage at one or more frequencies;
    calculating a Fourier transform of the sampled AC grid current at one or more frequencies;
    determine grid impedance at the one or more frequencies using the calculated Fourier transform of the sampled AC grid voltage divided by the calculated Fourier transform of the sampled AC grid current;
    compare the grid impedance at the one or more frequencies to a known expected grid impedance at the one or more frequencies; and
    detect a grid event based on the comparison.

11. The method of claim 10, wherein calculating the Fourier transform of the sampled AC grid voltage and calculating the Fourier transform of the sampled AC grid current comprises calculating a fast Fourier transform (FFT) of at least one of the sampled AC grid voltage and sampled AC grid current.

12. The method of claim 10, wherein the control system configured to sample AC grid voltage and AC grid current over the fixed period of time comprises the control system sampling AC grid voltage and AC grid current over one cycle of a fundamental frequency.

13. The method of claim 10, wherein the control system configured to compare the grid impedance at the one or more frequencies to the known expected grid impedance at the one or more frequencies comprises the control system configured to compare the grid impedance at the one or more frequencies to a known expected grid impedance range at the one or more frequencies.

14. The method of claim 10, wherein the control system configured to detect the grid event based on the comparison comprises the control system detecting that the grid event comprises islanding of at least one of the electrical machines.

15. The method of claim 14, wherein the at least one electrical machine comprises a doubly-fed induction generator (DFIG) driven by a wind turbine or a photovoltaic array.

16. A control system for detecting a grid event on an alternating current (AC) electrical grid connected with one or more electrical machines, said AC electric grid configured to transmit at least one phase of electrical power to the one or more electrical machines or to receive at least one phase of electrical power from the one or more electrical machines, said control system comprising:
- a controller electrically coupled to at least a portion of the AC electric grid, the controller in electronic data communication with at least a portion of the one or more electrical machines, the controller configured to determine a grid event of the AC electric grid based on one or more conditions monitored by the controller, wherein determining the grid event comprises:
  - sampling AC grid voltage and AC grid current over a fixed period of time;
  - calculating a Fourier transform of the sampled AC grid voltage at one or more frequencies;
  - calculating a Fourier transform of the sampled AC grid current at one or more frequencies;
  - determining grid impedance at the one or more frequencies using the calculated Fourier transform of the sampled AC grid voltage and the calculated Fourier transform of the sampled AC grid current;
  - comparing the grid impedance at the one or more frequencies to a known expected grid impedance at the one or more frequencies; and
  - detecting a grid event based on the comparison.

17. The system of claim 16, wherein the controller configured to compare the grid impedance at the one or more frequencies to the known expected grid impedance at the one or more frequencies comprises the controller configured to compare the grid impedance at the one or more frequencies to a known expected grid impedance range at the one or more frequencies.

18. The system of claim 16, wherein the controller configured to determine grid impedance at the one or more frequencies using the calculated Fourier transform of the sampled grid voltage divided by the calculated Fourier transform of the sampled grid current comprises the controller configured to calculate a fast Fourier transform (FFT) of the sampled grid voltage and sampled grid current at the one or more frequencies and determine the grid impedance at the one or more frequencies using the FFT of the sampled grid voltage divided by the FFT of the sampled grid current.

19. The system of claim 16, wherein the controller configured to determine grid impedance at the one or more frequencies using the calculated Fourier transform of the sampled grid voltage divided by the calculated Fourier transform of the sampled grid current comprises the controller configured to filter the grid voltage and filter the grid current at the one or more frequencies and determine the grid impedance at the one or more frequencies using the filtered grid voltage divided by the filtered grid current at the one or more frequencies.

* * * * *